United States Patent [19]

Kuppens et al.

[11] Patent Number: 4,494,902
[45] Date of Patent: Jan. 22, 1985

[54] METHOD OF AND DEVICE FOR FEEDING ELECTRIC AND/OR ELECTRONIC ELEMENTS TO GIVEN POSITIONS

[75] Inventors: Bernardus J. Kuppens; Hendrik C. Wardenaar, both of Eindhoven, Netherlands

[73] Assignee: U.S. Philips Corporation, New York, N.Y.

[21] Appl. No.: 399,042

[22] Filed: Jul. 16, 1982

[30] Foreign Application Priority Data

Jul. 29, 1981 [NL] Netherlands ............... 8103573

[51] Int. Cl.³ .................................... B65B 69/00
[52] U.S. Cl. ............................ 414/223; 29/740; 156/541; 156/584; 221/25; 221/74; 221/225; 294/2; 414/226
[58] Field of Search .............. 414/222, 416, 417, 737, 414/744 B, 752, 223; 221/25, 30, 69–71, 74, 224, 225; 294/2, 64 R; 29/740, 759; 156/DIG. 31, 252, 253, 541, 584

[56] References Cited

U.S. PATENT DOCUMENTS

| | | | |
|---|---|---|---|
| 3,274,038 | 9/1966 | Karn | 156/584 X |
| 3,785,507 | 1/1974 | Wiesler et al. | 414/417 X |
| 3,793,123 | 2/1974 | Aronson | 156/584 |
| 4,290,732 | 9/1981 | Taki et al. | 414/752 |
| 4,375,126 | 3/1983 | Dull et al. | 414/121 X |
| 4,410,103 | 10/1983 | Fuhrmeister | 221/25 |

FOREIGN PATENT DOCUMENTS 562884 10/1977 U.S.S.R. .................. 414/222

*Primary Examiner*—Leslie J. Paperner
*Assistant Examiner*—Donald W. Underwood
*Attorney, Agent, or Firm*—David R. Treacy

[57] ABSTRACT

A method for feeding chip components to positions in which they can be picked up by transfer members, in which the chips are pushed out of a feed channel while being held between an ejection pin and a transfer member part. An elongated part of a transfer member is advanced into a feed channel into contact with one side of a chip, an ejection pin then advances to the other side of the chip and pushes the chip and transfer member out of the feed channel through a removal opening, and the chip is then held by the transfer member while the ejection pin retracts. Preferably, a cover plate prevents movement of the chips toward the transfer member until the member is in contact with the side of the chip.

26 Claims, 8 Drawing Figures

METHOD OF AND DEVICE FOR FEEDING ELECTRIC AND/OR ELECTRONIC ELEMENTS TO GIVEN POSITIONS

BACKGROUND OF THE INVENTION

The invention relates to a method of feeding one or more series of electric and/or electronic elements to transfer positions along respective feed paths, and for transferring the elements, one from each of these positions at a time, by means of transfer members.

Methods of the kind forming the subject of the present invention are used for the feeding and positioning of elements on substrates. The elements of the desired kind are presented at transfer positions from their package or while still in their package, after which they are picked up by transfer members which deposit the individual elements of a series on the substrate in the correct positions. It is very important that the elements are always presented in the same position to be picked up by the transfer member.

SUMMARY OF THE INVENTION

It is an object of the invention to provide a method for feeding and transferring the elements which substantially precludes any deviation from the correct positioning of the elements during the feeding and transfer operations.

The method according to the invention is characterized in that the elements are intermittently fed to the transfer positions along a feed path in channels which enclose the individual elements on all sides except in the transfer direction; each of the channels has a removal opening at the area of the respective transfer position; and the transfer member has an elongated part or pin which is moved until its end contacts one side of the respective element during removal, after which the element is pressed out of the feed channel by a lifting or ejection pin which acts on the other side of the element while being held between the elongated part and the lifting pin.

In the method according to the invention, the elements are guided during feeding so that any deviation from the correct positions of the elements is precluded. Subsequently, the elements are each picked up at the transfer position between two pins so as to be pressed upwards, possibly out of their package. Thereafter, the element is held by the transfer member. Consequently, should an element become stuck in the respective feed channel or in the package for some reason, the lifting pins will ensure that this element will be smoothly moved through the removal opening in the direction of the transfer member.

When the transfer pin or elongated part approaches the element, there is a risk of the element jumping towards the pin or part due to electrostatic charging, so that a change of position of the element is likely to occur. In order to counteract this possibility, one embodiment of the method according to the invention is characterized in that each of the removal openings is partly closed by a movable closure member which is moved to open the opening fully only after the respective elongated part has contacted the element.

If the transfer members are constructed as suction tubes, the tubes may first be used as the elongated parts, the vacuum being created only after removal of the relevant element from its position in the respective feed channel.

The invention also relates to a device which enables elements to be very quickly fed to and picked-up by a transfer member in a reliable and accurate manner.

The device according to the invention is characterized in that it comprises feed channels in which the elements can be transported so that they are enclosed on all sides, each feed channel having a removal opening at the end of the channel a transfer member for each channel, situated opposite the respective removal opening in one position, and movable to another position to place the relevant element on a substrate, the transfer member comprising a transfer pin or elongated part which is movable in the direction of the respective removal opening a respective lifting pin for each feed channel, situated on the other side of the feed channel, approximately on the center line of the removal opening and a control mechanism for first moving each elongated part until it contacts the relevant element, and for subsequently displacing the respective lifting pin together with the element and the respective elongated part, after which the element is held by the transfer member and the lifting pin returns to its initial position.

In one embodiment of the device according to the invention each of the elongated parts is constructed as a suction tube.

In order to prevent premature movement of the relevant elements to the associated elongated parts due to electrostatic charging, each of the removal openings in a further embodiment can be partly closed by means of a movable closure member which fully opens the respective removal opening only when the respective elongated part bears on the relevant element.

In a further embodiment, the closure member is formed by a plate which bridges all the removal openings and which comprises for each opening a slit through which the respective elongated part can be brought into contact with the relevant element.

In order to permit the handling of elements of slightly varying thickness, the bottom of each of the feed channels in a further embodiment is resilient.

A device according to the invention for the feeding of several tapes, each having equispaced openings in which elements are packed, is further characterized in that the device comprises a number of parallel feed channels and a number of stepping pins which are arranged adjacent one another and each of which is movable into and out of a respective one of the channels in a reciprocating manner and, when projecting into the channel, is displaceable in the longitudinal direction of the channel over a distance corresponding to the center-to-center distance between the openings in the tapes. The device furthermore comprises a corresponding number of centering pins, each of which is arranged behind a corresponding one of the stepping pins in the direction of transport of the tapes and is movable into and out of the respective channel in a reciprocating manner after completion of the transport stroke of the respective stepping pin.

This device permits the stepwise transport of a number of tapes arranged very close to one another. The transport can be effected very quickly and with great accuracy. The various elements will thus always be accurately presented in the same position each time. Accurate presentation is a requirement for accurate picking-up and placement by the transfer members.

Each of the stepping pins in a further preferred embodiment of the device according to the invention is resiliently connected to an associated first reciprocable rod for movement therewith in a direction extending transversely of the feed channel, the ends of all the first rods which are remote from the stepping pins bearing against a drive member, and each of the stepping pins being pivotably connected to an associated transport lever which extends to the front and rear sides of the relevant stepping pin with respect to the direction of movement of the tapes and which is pivotably connected on one side of the pin to a fixed part of the device and on the other side to one end of an associated second reciprocable rod, the other ends of all the second rods bearing against a further drive member.

Thus, a device is obtained which has a very small width, viewed transversely of the transport direction. In fact, the drive members required for a tape need be no wider than the tape. Considering that a customary tape has a width of 8 mm, it will be clear how little space is occupied by the drive members in the transverse direction. Moreover, the operation is such that the first drive member simultaneously lifts all the first rods, each of the stepping pins then engaging in one of the transport holes in the relevant tape. Subsequently, the further drive member moves all the second rods so that the transport levers all pivot about their pivots on the fixed part of the device. As a result of this motion, each of the stepping pins is moved in such a way that its end which engages in the respective transport hole performs a stroke which corresponds to the center-to-center distance between the openings in the relevant tape which contain the elements. Consequently, the tapes are advanced through the center-center distance between two elememts and the next elements in each of the tapes is situated underneath the respective removal opening.

In order to enable the transport movement of one or more of the stepping pinds to be temporarily stopped, in a further embodiment of the device according to the invention each transport lever has a locking device which can be operated to block the movement of the relevant lever when no tape transport is desired.

In order to ensure that the elements in all the tapes are situated exactly underneath the relevant removal opening, a further preferred embodiment comprises, in addition to each first and each second rod, a third reciprocable rod, one end of which supports a centering pin and the other end of which bears against a common drive element, each of the third rods being resiliently pressed against a guide which is preferably formed by two balls which are accommodated in a fixed part of the device at a distance from one another.

The tapes emerging from the feed channels may have a considerable length which may create storage problems. To mitigate these problems, at the end of each feed channel there may be arranged a blade which is movable across the exit of the channel by a drive means. This blade cuts the tape into small pieces, so that storage is no longer a problem.

In a preferred embodiment of the device according to the invention, the portions of the upper sides of the feed channels which are situated at the entrances of the channels are formed by a plate element which extends substantially as far as the area of the upper sides of the channels at which the openings for the removal of the elements are situated, and which comprises a slightly rounded nose portion at this area by means of which any cover foil present on the tapes can be removed from the tapes.

This plate element with the nose portion may form part of a holder for the storage, transport and feeding of tapes to the feed channels. Such a holder comprises a frame in which a number of tape reels can be rotatably suspended. The frame includes means for coupling the holder to the feeding and transfer device, the frame also being constructed to support a number of foil-peeling reels in a resilient manner such that the coupling of the holder to the device places the reels in frictional contact with a drive roller on the device.

Thus, a large number of reels can be simultaneously coupled to the device by means of the holder. The stepping pins then directly engage in the transport holes of the relevant tapes and any cover foils present on the tapes are wound onto the foil-peeling reels.

The time required for replacing the reels is thus minimized.

The invention will be described in detail hereinafter with reference to the drawing.

DESCRIPTION OF THE PREFERRED EMBODIMENT

Figure 1A:
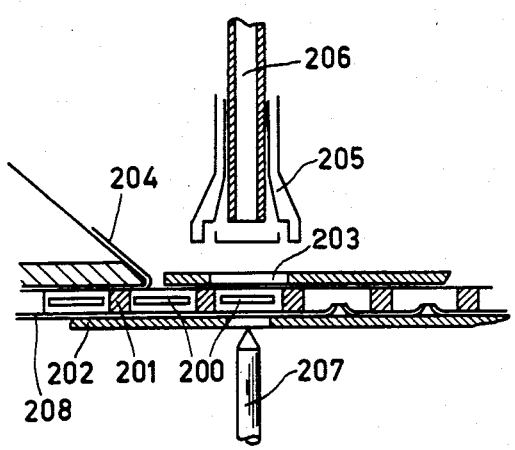
FIGS. 1a, b, c, d are sectional views of a lifting and elongated suction pins portion of a device embodying the invention, showing the steps involved in the feeding and transfer of an element.
Figure 1B:
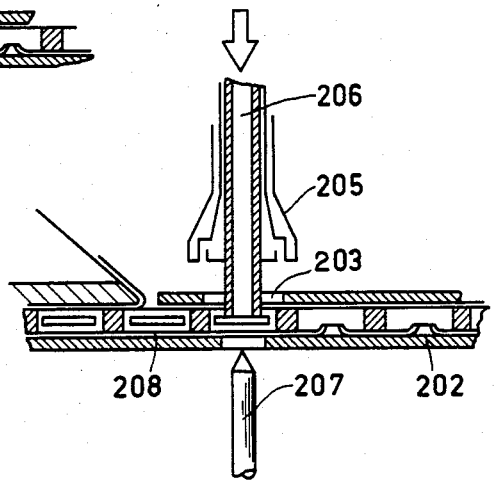
Figure 1C:
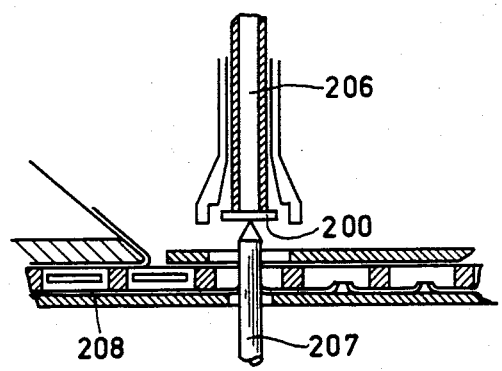
Figure 1D:
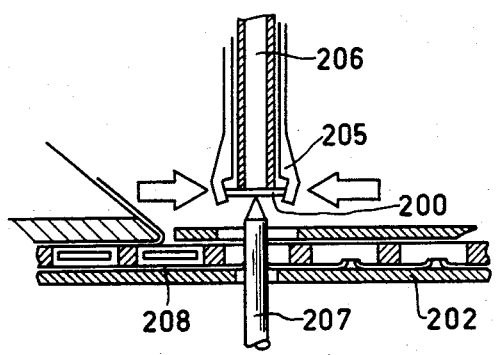

FIGS. 1a, b, c, d illustrate diagrammatically the picking-up of an element by a transfer member. FIG. 1a shows how the elements 200, which are accommodated in a package and transport tape 201, are transported in a feed channel 202 along a feed path to a removal opening 203. During the transport, the upper foil 204 is peeled off the tape. Over the removal opening 203 there is arranged a transfer member 205 which comprises a transfer pin or elongated part 206 termed as a suction tube, which is capable of performing a reciprocating movement. Underneath the tape there is arranged a lifting pin or needle 207 which is situated substantially on the center line of the removal opening. The movement sequence is such that first the transfer pin 206 is lowered until it contacts the element 200 (FIG. 1b). Subsequently, the lifting needle 207 moves in the transfer direction, upwards, taking with it the element 200 and the transfer pin 206 (FIG. 1c). Subsequently, the element 200 is held by the transfer member 205 and is ready for further transport and positioning of the substrate. During its upwards movement, the needle 207 can puncture the lower foil 208 of the tape. It is also possible to use a tape whose lower foil is already perforated. Even though the foregoing description concerns the feeding of elements packed in a tape, it is equally possible to supply the elements loosely to the feed channel. Because the feed channel encloses the elements on all sides, their orientation in the channel is exactly defined whether they are in a packed or unpacked condition, and this orientation will be maintained during the entire process.

Figure 2:
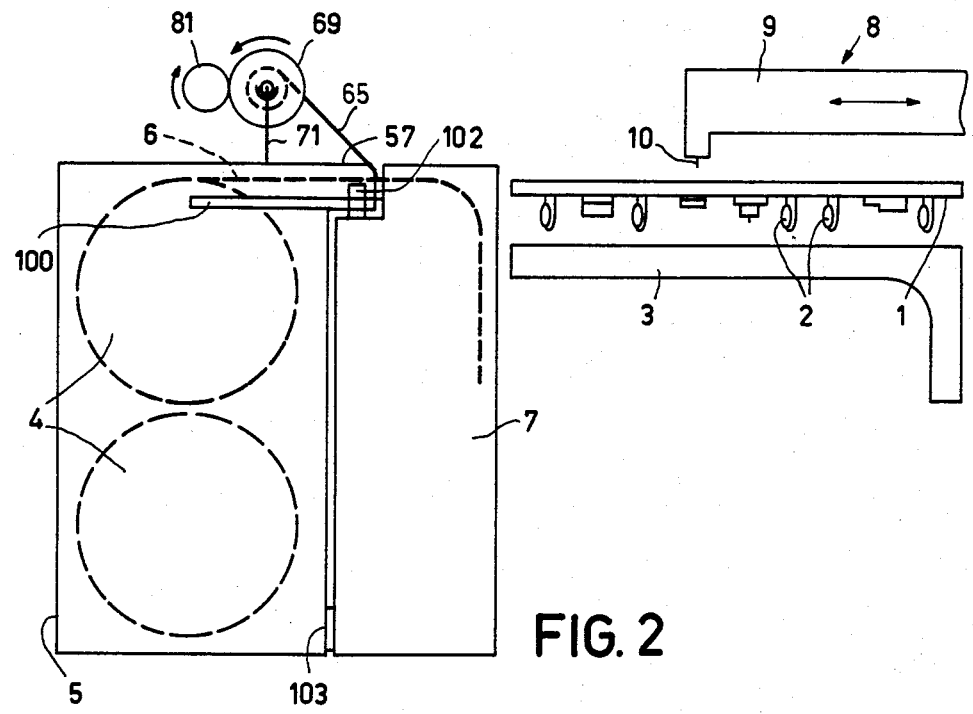
FIGS. 2 and 3 show diagrammatically a multiple device for the positioning of electric and/or electronic elements on a substrate.
Figure 3:
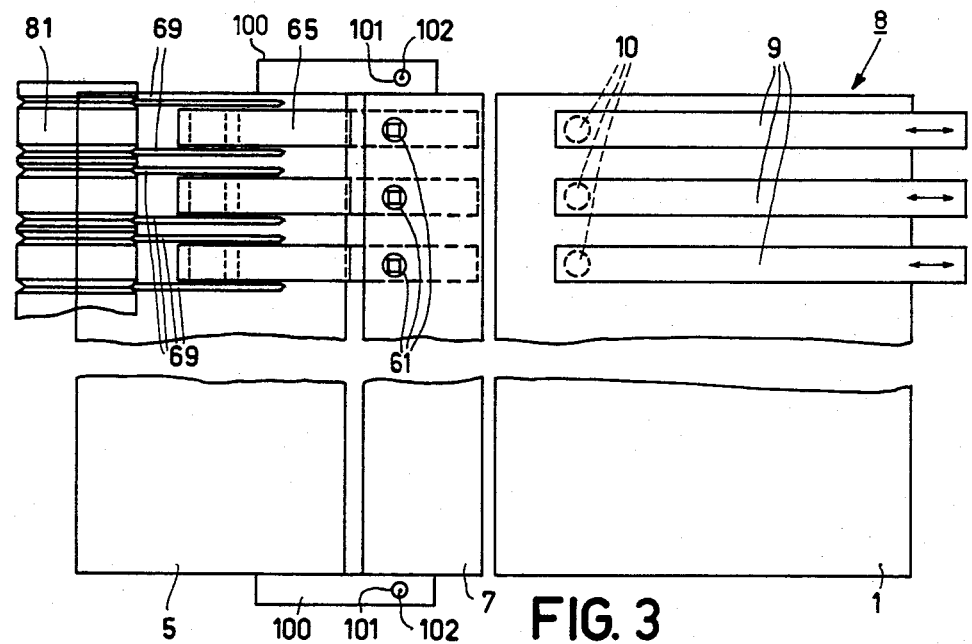

The reference numeral 1 in FIG. 2 denotes a substrate, for example, a printed circuit board, the lower side of which has already been provided with conventional elements 2 whose lead-outs are positioned in holes in the substrate. A large number of further elements which are very small and which do not comprise lead-outs have to be provided on the upper side of the substrate. The dimensions of this kind of element, commonly referred to as a chip, are of the order of $3.2 \times 1.6$ mm. These chips must be very accurately positioned on the substrate at a very small distance from one another.

The substrate 1 is supported by a substrate carrier 3.

The elements to be positioned are packed in tapes 6 which have transport holes, the elements being loosely accommodated in openings in the tape, the openings being closed on the lower side by a lower foil and on the upper side by a cover foil.

A number of such tapes is carried on reels 4 in a holder 5. The number of reels present in the holder 5 depends on the circumstances. Thirty-two is the customary number in this respect, the reels then being rotatably mounted in the holder 5 at two levels.

The holder 5 comprises on both sides a projecting plate 100 provided with a hole 101 arranged to fit over a pin 102 on the feed device 7. The holder 5 comprises at the bottom two supports 103 with which the holder bears against the feed device.

The tapes 6 each extend from the respective reel 4 to a device for feeding the tape to a given position. The present embodiment comprises thirty-two of such devices, so that during each cycle thirty-two elements are presented. These elements are removed from the tape by a transfer mechanism 8 which for each removal position, of which there are thirty-two in the present embodiment, comprises essentially a reciprocable arm 9 with a suction tube 10.

Figure 4:
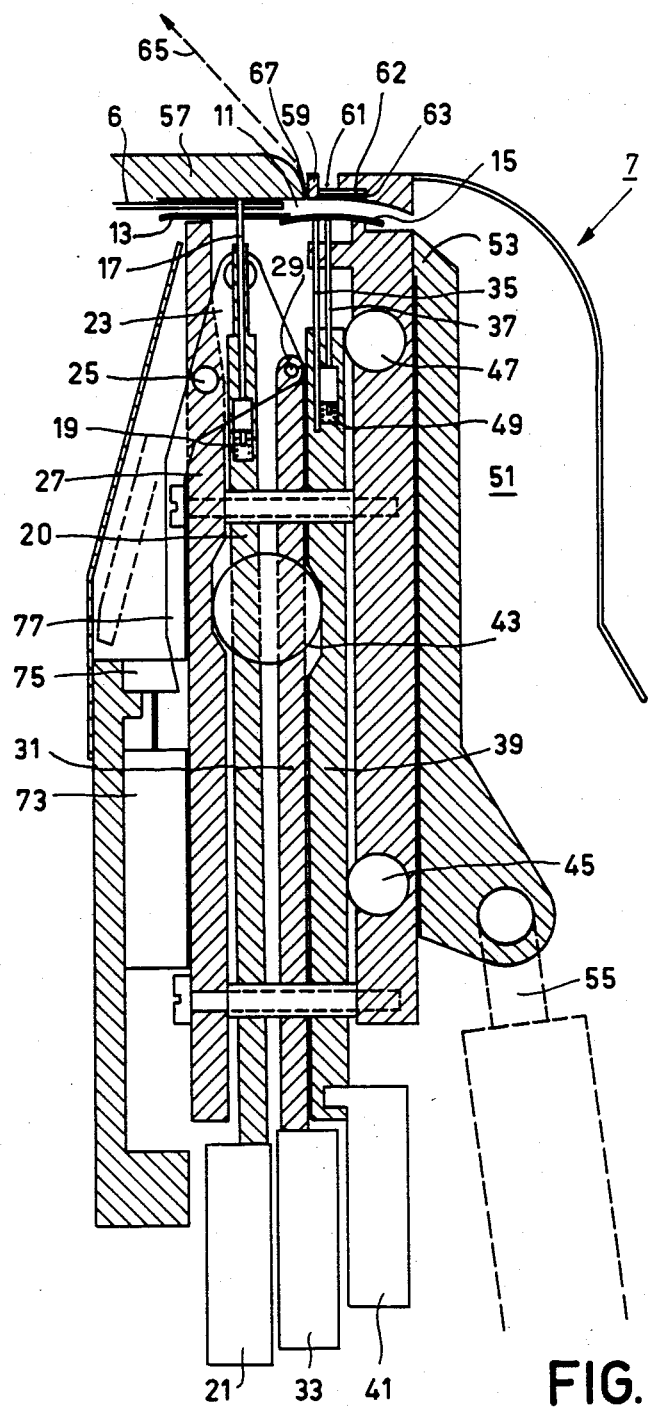
FIG. 4 is a cross-sectional view of a device for the simultaneous feeding of a plurality of elements to a given position.

FIG. 4 is a detailed cross-sectional view of the feed device 7. For each tape 6 the device comprises a feed channel 11, only one of the feed channels being visible.

The bottom of the feed channel 11 is formed by two resilient members 13 and 15. These members prevent jamming due to small thickness variations of the tape and also enable the device to handle tapes of different thickness.

The bottom member 13 has an opening through which a stepping pin 17 can be introduced into the feed channel. The stepping pin 17 is connected through a spring 19 to a first rod 20 which is pressed by a spring (not shown) against a first drive bar 21 which drives all thirty-two first rods.

The stepping pin 17 is pivotably and slidably connected to a stepping lever 23 which on one side of the stepping pin is pivotably connected, at 25, to the frame 27 of the device. On the other side of the stepping pin, at 29, the stepping lever is pivotably connected to a second rod 31 which is pressed by a spring (not shown) against a second drive bar 33 which co-operates with all the second rods of the device.

The resilient bottom member 15 comprises two openings through which a centering pin 35 and an ejector or lifting pin 37 can be moved into the feed channel.

The centering pin 35 is rigidly connected to one end of a third rod 39, the other end of which is coupled to a third drive bar 41 which co-operates with all the third rods of the device.

The third rod 39 is pressed by a circular spring 43 against a guide which is formed by two balls 45 and 47 which are supported in the frame of the device.

The third rod 39 is connected to the ejector pin 37 via a weak spring 49.

The channel 11 opens into a waste duct 51 for the empty tapes. The long length of these empty tapes may sometimes cause problems. To mitigate these problems, the device comprises a blade 53 which can be moved across the exit of the channel 11 by a drive 55, thus cutting the empty tapes into small pieces which can readily be discharged from the waste duct 51.

Part of the upper side of the feed channel 11 is formed by a plate 57 which forms part of the holder 5 for the tapes.

A further part 59 of the frame 27 forms part of the upper side of the channel along one edge of a slit or opening 61 which is bridged by two flat bars 62 and 63 which are arranged one above the other and functions as closure members. Each of these bars comprises as many holes as there are removal positions. The bars are slidable with respect to one another so that the holes in the two bars either register with one another and are therefore open or do not register and are consequently closed. When the holes are open, the relevant elements can be removed from the tapes. When the holes are closed, the elements cannot leave their positions, although the holes in the bars are shaped so that at each removal position a small central opening remains through which the respective suction tube can be positioned on the respective element. It is only after the positioning of the suction tube that the hole is further opened, so that the relevant element can be removed.

When the device is put into operation, a tape has to be fed to the feed channel 11; because the device always has a multiple construction, customarily a 32-fold construction, thirty-two tapes have to be fed simultaneously. This can be done in various ways. In order to permit the rapid replacement of tapes, however, it is advantageous to use a tape holder 5 in which thirty-two reels 4 can be rotatably suspended and which can be coupled to the device via suitable means 100, 101, 102.

Figure 5:
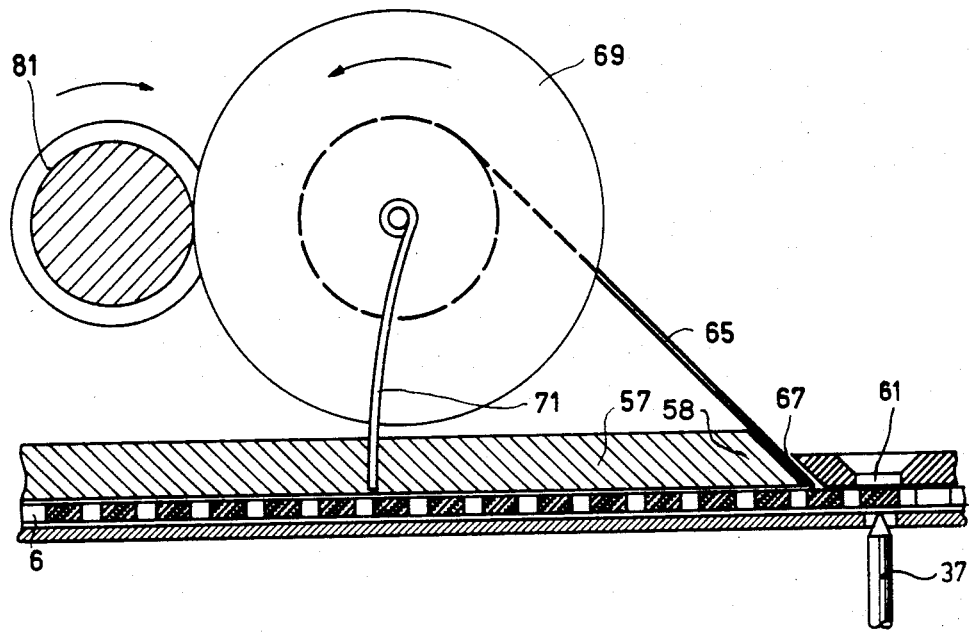
FIG. 5 is a diagrammatic sectional view of a part of the device of FIG. 4 on an enlarged scale.

The tape holder 5 includes the cover plate 57 which also forms part of the upper side of each feed channel 11, and has a mass portion 58 over which any cover foil provided on the tape, for example, the cover foil 65, can be peeled off via a slit 67. This is shown on an enlarged scale in FIG. 5, which also shows the cover foil 65 being wound onto a reel 69 which is supported on the tape holder by leaf springs 71. The coupling of the tape holder to the feed device brings all the reels 69 into frictional contact with a drive roller 81 which forms part of the feed device 7.

When the tape holder 5 is coupled to the feed device 7, the tapes are situated so far along the cover plate 57 that at least one transport hole is present between the stepping pin 17 and the cover plate.

The stepping pins are resiliently connected to their rods 20, so that when the tape holder 5 is coupled to the feed device, the pins, which are directed upwards, are pressed down except where by change a pin encounters a transport hole.

When the machine is started, the second rods 31 will be moved downwards by downward movement of the second drive bar 33, the stepping levers 23 then pivoting about their respective pivots 25. Consequently, the stepping pins 17 perform a stroke to the right which corresponds to the distance between the centers of the transport holes, which usually amounts to 4 mm.

During this movement, each stepping pin engages in a transport hole and transports the respective tape so that at the end of this stroke all the tapes register and an opening of each tape is situated underneath a removal position.

Subsequently, the centering pins and the ejector pins are simultaneously raised.

The centering pin 35 centers the tape through a transport hole which is situated near the removal position. Subsequently, the ejector or lifting pin 37 contacts the lower side of the tape. The ejector pin 37 then briefly stops while the drive continues, the spring 49 thus being compressed approximately 2 mm.

The suction tube 10 must have reached the elements from above before that.

The ejector pins 37 then move further upwards, during which movement they first pierce the lower foil or the bottom of the tape. Subsequently, the ejector pins press the relevant elements with the suction tubes resting thereon upwards in the transfer direction over a given distance. Subsequently, the rod 39 with the centering pin and the ejector pin is moved downwards again, so that the next cycle may commence.

The driving of the bars 21, 33 and 41 can be effected by means of an electric motor which drives a shaft with three cam discs.

Each of the cam discs drives one of the bars 21, 33 and 41 which extends underneath all thirty-two feed channels.

Should one of the suction tubes have failed to lift an element for some reason, the transfer mechanism 8 will still attempt to position an element in the relevant position. However, all the suction tubes first complete their stroke, after which only the tape concerned must be shifted one position further in order to present the missing element.

The feed device then again performs a complete stroke during which, however, the stepping movements of all the stepping pins are blocked except the stepping pin associated with the tape with the missing element. This blocking operation is effected by means of an electromagnet 73 which introduces a wedge 75 between an extension 77 of the stepping lever 23 and a stationary part of the device. As a result, the stepping pins 17 of the devices whose stepping levers are blocked will not perform the transport stroke and only the tape associated with the suction tube which missed an element during the previous stroke will be transported.

In order to ensure that elements cannot leave the tapes at the area of the removal positions due to vibrations, shocks or static charging, the removal positions are closed at the upper side by the two bars 62, 63. The bars 62, 63 extend across all thirty-two removal positions and each bar has thirty-two holes which are large enough to allow the relevant elements to pass through them. The bars 62, 63 are slidable in their longitudinal direction transverse to the feed and transfer directions. In the open condition the holes in the two bars register with one another over the relevant elements, so that the elements can be removed from the tapes. In the closed condition, the holes are not completely closed; in each case a small opening remains in the center through which the respective suction tube can still pass. The holes are fully opened only when the suction tubes bear on the elements.

Instead of the described construction a cover plate can be used which comprises a number of cut-outs which are open at one side and through which the suction tube can be pressed against an element, after which the plate can be moved to one side in order fully to open the removal opening.

The bottom members 13 and 15 are resilient in order to ensure that tapes having a variety of thicknesses can be accurately located, so that elements cannot escape from the tape.

The dimension of a single feed channel in the transverse direction is very small, namely only approximately 10 mm.

What is claimed is:

1. A method of feeding and transferring elements, comprising feeding a series of elements along a feed path in a feed direction, so as to move the elements one at a time to a transfer position; and transferring an element from said transfer position in a transfer direction by a transfer member, characterized by the additional steps of defining said feed path by a feed channel enclosing said series of elements on all sides except in the transfer direction, said feed channel having a removal opening at the transfer position to permit movement of an element in the transfer direction, moving an end of an elongated part of a transfer member through said removal opening into contact with one side of an element at the transfer position, moving an ejection pin into contact with the other side of the element, pressing the element out of the respective transfer position by further movement of the ejection pin, while holding the element between the ejection pin and the elongated part, and then holding the element by the transfer member and transferring the element to another, selected position.

2. A method as claimed in claim 1, characterized in that said elongated part is formed as a suction tube, and in that the method includes the step of creating suction in the tube only after said pressing step.

3. A method as claimed in claim 1 or claim 2, characterized by the additional step of preventing movement of an element out of the feed channel in the transfer direction toward the end of the respective elongated part, prior to contact of the end of the elongated part against the one side of the element.

4. A method as claimed in claim 3, characterized in that said preventing step comprises partly closing each removal opening with a removable closure member, and moving the closure member so as to open the opening fully only after the end of the elongated part has contacted the one side of the element.

5. A method of feeding and transferring a plurality of series of elements, comprising feeding a plurality of series of elements along a corresponding plurality of parallel feed paths in a feed direction, so as to move the elements one at a time to a corresponding plurality of transfer positions; and transferring an element from said transfer position in a transfer direction by a transfer member, characterized by the additional steps of defining said feed paths by a corresponding plurality of respective feed channels enclosing each of said series of elements on all sides except in the transfer direction, each of said feed channels having a respective removal opening at the transfer position to permit movement of an element in the transfer direction, simultaneously moving an end of a corresponding elongated part of each of a corresponding plurality of respective transfer members through each respective removal opening into contact with one side of an element at the respective transfer position, moving a respective one of a corresponding plurality of ejection pins into contact with the other side of each respective element, simultaneously pressing the elements out of the respective transfer positions by further movement of the ejection pins, while holding the elements between each respective ejection pin and elongated part, and then holding each element so pressed out by the respective transfer member and transferring the element to another, selected position.

6. A method as claimed in claim 5, characterized in that each elongated part is formed as a suction tube, and in that the method includes the step of creating suction in each of the tubes only after said pressing step.

7. A method as claimed in claim 5 or claim 6, characterized by the additional step of preventing movement of an element out of the feed channel in the transfer direction toward the end of the respective elongated part, prior to contact of the end of the respective elongated part against the one side of the element.

8. A method as claimed in claim 7, characterized in that said preventing step comprises partly closing each of the removal openings with a removable closure member, and moving the closure member so as to open the openings fully only after the end of each elongated part has contacted the one side of the respective element.

9. A device for heating and transferring a plurality of series of elements, comprising a plurality of feed channels arranged substantially parallel with each other, each channel defining a feed path and enclosing said path on all sides, and having a removal opening at an end of the channel, said removal openings being arranged in a straight line, a corresponding plurality of transfer members disposed opposite each respective removal opening, means for moving the transfer members in a transfer direction transverse to said feed direction, characterized in that each of said transfer members comprises an elongated part having an end disposed toward the feed channel, said means for moving the transfer member includes means for moving said elongated part through said removal opening into contact with one side of an element located at the transfer position aligned with said opening, and the device further comprises a corresponding plurality of ejection pins disposed to the other side of the feed channel opposite respective elongated parts, and means for first moving each respective elongated part until it contacts a respective element at the transfer position, subsequently displacing the respective ejection pin together with the element and the elongated part, and then holding the element by the transfer member and returning the ejection pin to its initial position.

10. A device as claimed in claim 9, characterized in that each of said elongated parts is formed as a suction tube, and in that the device further includes means for applying vacuum to said suction tube only after the element together with the ejection pin and the elongated part have been moved out of the feed channel.

11. A device as claimed in claim 10 or 9, characterized by comprising means for partly closing each of said removal openings so arranged that the elongated part can pass through the partly closed opening to contact one side of a respective element in the transfer position within the respective feed channel, said means preventing movement of an element toward an approaching elongated part while said means is partly closing the respective removal opening.

12. A device as claimed in claim 11, characterized in that said means for partly closing comprises a plate which extends across the removal openings of each of the feed channels, and which has a respective slit opening aligned with each of said removal openings when the plate is in the partly closing position, arranged such that the respective elongated parts can pass through respective slits into each of the removal openings.

13. A device as claimed in claim 12, characterized in that the bottom of each of the feed channels is resilient.

14. A device as claimed in claim 9, characterized in that the bottom of each of the feed channels is resilient.

15. A device as claimed in claim 13, characterized by further comprising a corresponding plurality of stepping pins arranged adjacent one another and aligned to be movable into and out of respective channels, means, responsive to said stepping pins having been moved into the channels, for displacing said pins in the feed direction over a distance corresponding to the center-to-center distance between said openings in said tapes, a corresponding plurality of centering pins each of which is arranged behind a respective one of the stepping pins in the feed direction, and means for moving said centering pins into and out of the respective feed channels in a reciprocating manner after completion of the transport stroke of the respective stepping pin.

16. A device as claimed in claim 9, characterized by further comprising a corresponding plurality of stepping pins arranged adjacent one another and aligned to be movable into and out of respective channels, means, responsive to said stepping pins having been moved into the channels, for displacing said pins in the feed direction over a distance corresponding to the center-to-center distance between said openings in said tapes, a corresponding plurality of centering pins each of which is arranged behind a respective one of the stepping pins in the feed direction, and means for moving said centering pins into and out of the respective feed channels in a reciprocating manner after completion of the transport stroke of the respective stepping pin.

17. A device as claimed in claim 16, characterized by comprising corresponding pluralities of first and second reciprocable rods arranged for movement in a direction transversely to said feed direction, a drive member arranged to bear against first ends of each of said first reciprocable rods, said first ends being remote from the stepping pins, a further drive member arranged to bear against an end of each of said second reciprocable rods which is remote from the feed channel, and a corresponding plurality of transport levers, each pivotably connected to a fixed part of the device, to one side of the pivotal connection to the device each of said stepping pins being pivotably connected to a respective transport lever, and to the other side of the pivotal connection to the device each of said levers being pivotably connected to the other end of a respective reciprocable rod, so arranged that movement of the second reciprocable rod transversely to the feed direction moves the corresponding stepping pin in the feed direction, each of said stepping pins being resiliently connected to a respective first reciprocable rod for movement with said first rod in a direction transversely of the feed channel.

18. A device as claimed in claim 15, characterized by comprising corresponding pluralities of first and second reciprocable rods arranged for movement in a direction transversely to said feed direction,
- a drive member arranged to bear against first ends or each of said first reciprocable rods, said first ends being remote from the stepping pins,
- a further drive member arranged to bear against an end of each of said second reciprocable rods which is remote from the feed channel, and
- a corresponding plurality of transport levers, each pivotably connected to a fixed part of the device, to one side of the pivotal connection to the device each of said stepping pins being pivotably connected to a respective transport lever, and to the other side of the pivotal connection to the device each of said levers being pivotably connected to the other end of a respective reciprocable rod, so arranged that movement of the second reciprocable rod transversely to the feed direction moves the corresponding stepping pin in the feed direction, each of said stepping pins being resiliently connected to a respective first reciprocable rod for movement with said first rod in a direction transversely of the feed channel.

19. A device as claimed in claim 18, characterized by comprising a corresponding plurality of locking devices associated with each respective transport lever, said blocking devices being movable so as to block movement of the respective transport lever.

20. A device as claimed in claim 17, characterized by comprising a corresponding plurality of locking devices associated with each respective transport lever, said locking devices being movable so as to block movement of the respective transport lever.

21. A device as claimed in claim 19, characterized by comprising a corresponding plurality of third reciprocable rods,
- a drive member for driving the third reciprocable rods, and
- means for guiding said third rods comprising two respective guide balls for each third rod, accommodated in a fixed part of the device and spaced from one another,
- a respective centering pin being supported at the end of each of said third reciprocable rods remote from said third drive member.

22. A device as claimed in claim 16, characterized by comprising a corresponding plurality of third reciprocable rods,
- a drive member for driving the third reciprocable rods, and
- means for guiding said third rods comprising two respective guide balls for each third rod, accommodated in a fixed part of the device and spaced from one another,
- a respective centering pin being supported at the end of each of said third reciprocable rods remote from said third drive member.

23. A device as claimed in claim 21, characterized by comprising a plate forming a portion of the upper sides of each of the feed channels extending substantially to the area of the channel sides at which the removal openings are disposed, each of said plates having a slightly rounded nose portion at said area arranged to remove any cover foil present on a tape being used to feed elements to the feed channel.

24. A device as claimed in claim 9, characterized by comprising a plate forming a portion of the upper sides of each of the feed channels extending substantially to the area of the channel sides at which the removal openings are disposed, each of said plates having a slightly rounded nose portion at said area arranged to remove any cover foil present on a tape being used to feed elements to the feed channel.

25. A device as claimed in claim 24, characterized in that said cover plates form part of a holder for the storage, transport and feeding of tapes to the respective feed channels, said holder comprising a frame for suspending rotatably a plurality of tape reels, and means for coupling the holder to the device,
- said holder further comprising a corresponding plurality of foil-peeling reels resiliently mounted to the frame, and
- said device further comprises a drive roller arranged to frictionally engage said foil-peeling reels.

26. A device as claimed in claim 23, characterized in that said cover plates form part of a holder for the storage, transport and feeding of tapes to the respective feed channels, said holder comprising a frame for suspending rotatably a plurality of tape reels, and means for coupling the holder to the device,
- said holder further comprising a corresponding plurality of foil-peeling reels resiliently mounted to the frame, and
- said device further comprises a drive roller arranged to frictionally engage said foil-peeling reels.

* * * * *